United States Patent
Groh

(10) Patent No.: US 9,219,521 B2
(45) Date of Patent: Dec. 22, 2015

(54) SUB-BAND SPLITTER UNIT AND ENVELOPE CURVES DETECTOR PROVIDED WITH A SUB-BAND SPLITTER UNIT

(71) Applicant: INSTITUT FUR RUNDFUNKTECHNIK GMBH, Munich (DE)

(72) Inventor: Jens Groh, Munich (DE)

(73) Assignee: INSTITUT FUR RUNDFUNKTECHNIK GMBH, Munich (DE)

(*) Notice: Subject to any disclaimer, the term of this patent is extended or adjusted under 35 U.S.C. 154(b) by 0 days.

(21) Appl. No.: 14/408,915

(22) PCT Filed: Jun. 18, 2013

(86) PCT No.: PCT/EP2013/062649
§ 371 (c)(1),
(2) Date: Dec. 17, 2014

(87) PCT Pub. No.: WO2013/189942
PCT Pub. Date: Dec. 27, 2013

(65) Prior Publication Data
US 2015/0188588 A1 Jul. 2, 2015

(30) Foreign Application Priority Data

Jun. 19, 2012 (IT) .............................. TO2012A0530
Dec. 7, 2012 (IT) .............................. TO2012A0617

(51) Int. Cl.
*H04L 27/06* (2006.01)
*H04B 1/66* (2006.01)
(Continued)

(52) U.S. Cl.
CPC ................ *H04B 1/66* (2013.01); *H03G 7/002* (2013.01); *H03G 7/007* (2013.01); *H03G 9/025* (2013.01);
(Continued)

(58) Field of Classification Search
CPC .......... H04B 1/1638; H04B 1/18; H04B 1/66; H04B 1/0017; H03H 17/0267; H03G 7/002; H03G 9/025; H03G 7/007
See application file for complete search history.

(56) References Cited

U.S. PATENT DOCUMENTS 5,235,647 A    8/1993  Van de Kerkhof
5,926,791 A *  7/1999  Ogata .................... H04N 19/63
                                                    375/240.11

(Continued)

FOREIGN PATENT DOCUMENTS

WO        98/49775        11/1998

OTHER PUBLICATIONS

International Search Report dated Jan. 22, 2014, issued in PCT/EP2013/062649, filed Jun. 18, 2013.
Bruce A. Thomas et al., *Practical Implementation of Multirate Convolution for Multiresolution Image Processing*, 1998 IEEE Southwest Symposium, Apr. 5, 1998, pp. 217-222.
Zorn Cvetkovic et al., *Oversampled Filter Banks*, IEEE Transactions on Signal Processing, vol. 46, No. 5, May 1998, pp. 1245-1255.
(Continued)

*Primary Examiner* — Syed Haider
(74) *Attorney, Agent, or Firm* — Workman Nydegger

(57) ABSTRACT

A sub-band splitter unit for splitting a broadband input signal in K narrowband sub-band signals, wherein K is an integer larger than 1, which sub-band splitter unit is provided with an input terminal for receiving the broadband input signal and K−1 sub-band filter circuits, each of the sub-band filter circuits is provided with an input and a first and a second output, a first filter arrangement coupled between the input and the first output, a second filter arrangement coupled between the input and the second output, and the sub-band splitter unit is provided with K output terminals for supplying the K sub-band signals. The first output of a k-th sub-band filter circuit is coupled to an input ($103.k+1$) of the (k+1)-th sub-band filter circuit. The input of the first sub-band filter circuit is coupled to the input of the sub-band splitter unit.

17 Claims, 4 Drawing Sheets

(51) Int. Cl.
- H03G 7/00 (2006.01)
- H03H 17/02 (2006.01)
- H04B 1/00 (2006.01)
- H04B 1/16 (2006.01)
- H04B 1/18 (2006.01)
- H03G 9/02 (2006.01)

(52) U.S. Cl.
CPC .......... *H03H 17/0267* (2013.01); *H04B 1/001* (2013.01); *H04B 1/0017* (2013.01); *H04B 1/1638* (2013.01); *H04B 1/18* (2013.01)

(56) References Cited

U.S. PATENT DOCUMENTS

| | | | |
|---|---|---|---|
| 2010/0146026 A1* | 6/2010 | Christoph | 708/313 |
| 2011/0137659 A1* | 6/2011 | Honma et al. | 704/500 |
| 2011/0286618 A1 | 11/2011 | Vandali et al. | |

OTHER PUBLICATIONS

Y. T. Chan et al., *Multiresolution Analysis, Its Link to the Discrete Parameter Wavelet Transform, and Its Initialization*, IEEE Transaction of Signal Processing, vol. 44, No. 4, Apr. 1996, pp. 1001-1006.

Hitoshi Kiya et al., *A Linear Phase Two-Channel Filter Bank Allowing Perfect Reconstruction*, Proceedings of the International Symposium on Circuits and Systems, vol. 2, May 1992, pp. 951-953.

Michael Unser, *Texture Classification and Segmentation Using Wavelet Frames*, IEEE Transactions on Image Processing, vol. 4, No. 11, Nov. 1995, pp. 1549-1560.

Tao Chen et al., *Discrete Wavelet Frame Representations of Color Texture Features for Image Query*, Multimedia Signal Processing, 1998 IEEE Second Workshop, Dec. 1998, pp. 45-50.

International Preliminary Report on Patentability and Written Opinion dated Dec. 31, 2014, issued in PCT/EP2013/062649, filed Jun. 18, 2013.

* cited by examiner

SUB-BAND SPLITTER UNIT AND ENVELOPE CURVES DETECTOR PROVIDED WITH A SUB-BAND SPLITTER UNIT

BACKGROUND OF THE INVENTION

The invention relates to a sub-band splitter unit and an envelope curves detector provided with a sub-band splitter unit. A sub-band splitter unit according to the preamble of claim 1 is known from U.S. Pat. No. 5,235,647. This known sub-band splitter unit operates together with an associated sub-band combining unit for combining the K narrowband sub-band signals of the sub-band splitter unit for generating a broadband output signal that is a replica of the broadband input signal of the sub-band splitter unit.

In the known sub-band splitter unit, the broadband input signal is, by means of down-sampling, converted into narrowband (subsampled) sub-band signals, and, in the sub-band combining unit, these narrowband sub-band signals are, by means of up-sampling, converted back into a replica of the input signal with the same sampling rate as the one of input signal.

The sub-band splitting unit known from U.S. Pat. No. 5,235,647 includes sub-band filter circuits for generating the K narrow-band sub-band signals. The sub-band combining unit cooperating therewith also comprises filter circuits for combining the K narrowband sub-band signals for generating the replica of the broadband input signal of the sub-band splitter unit. U.S. Pat. No. 5,235,647 proposes to select the filter length of the filter circuits in the sub-band splitter unit unequal to the filter length of the filter circuits in the sub-band combining unit. It is thereby achieved that, for example, the complexity of the signal processing in the sub-band splitter unit be selected greater and the complexity of the signal processing in the sub-band combining smaller, for example, at constant transmission quality of the transmission path between the input of the sub-band splitter unit and the output of the sub-band combining unit.

SUMMARY OF THE INVENTION

Object of the invention is to provide an improved sub-band splitter unit and sub-band combining unit cooperating therewith and an envelope curves detector, which comprises the sub-band splitter unit according to the invention.

This object is achieved in that the sub-band splitter unit according to the invention is characterized by the features of the characterizing portion of the claim 1. The sub-band combining unit according to the invention is characterized by the features of claim 8.

The envelope curves detector according to the invention is characterized by the features of claim 9.

Advantageous developments of the sub-band splitting unit according to the invention and of the envelope curves detector according to the invention are defined by the dependent claims.

A known means for splitting the input signal into frequency bands is a filter bank. By means thereof, the sub-band signals are derived from the input signal. Typical such filter banks have the property that the sub-band signals, apart from a possible overall delay, additively reconstitute the input signal (conservation of the sum signal).

For this purpose, known sub-band splitting units, such as the already-mentioned one from U.S. Pat. No. 5,235,647, include an analysis filter bank, wherein the sampling rate is reduced (down-sampling), and a corresponding synthesis filter bank, wherein the sampling rate is increased (up-sampling), typically back to the original sampling rate.

It is known that envelope curves signals for the frequency bands can be derived by means of power measurements. It is also known that one can measure the power for a sub-band by squaring the sub-band signal and, as may be the case, subsequent smoothing. However, a disadvantage may be that the condition that the integrated sum of these powers is equal to the integrated power of the input signal (conservation of the energy sum) is not generally met. As a result, for broadband signals the power sum thereof is not necessarily represented by the aggregate of the sub-band envelope curves signals in a manner free of errors.

The idea of the invention lies in providing an analysis filter bank with a structure that has the property of conserving the sum signal and wherein the corresponding synthesis filter bank reduces to an addition of the sub-band signals. This is achieved in that the sampling rate of the input signal is maintained for the sub-band signals.

Another idea is that the envelope curves signals are formed from sub-band power signals whose integrated sum is equal to the integrated power of the input signal (conservation of the energy sum). For this purpose, the sub-band power signals split the power of the input signal into substantially the same frequency bands into which the input signal is split in order to form sub-band signals. To compensate for errors regarding the total energy of the sub-band signals, the filter bank is further extended by a number of outputs for supplemental sub-band signals, which are also derived from the input signal. Thereby, there is one supplemental sub-band signal per frequency band allocation. Each sub-band power signal is derived from a combination of the squared sub-band signal of the respective frequency band and a squared supplemental sub-band signal assigned to the frequency band. This effects that the integrated squared sub-band signals and the integrated squared supplemental sub-band signals, apart from a possible delay, additively reconstitute the integrated squared input signal (conservation of the energy sum).

In addition, a portion of the squared supplemental sub-band signals is optionally redistributed between the sub-bands prior to being combined with the squared sub-band signals. This modified form of the derivation of the sub-band power signals effects smoother envelope curves signals. Furthermore, this form of derivation allows for an optimization of the consistency between the frequency band limits of the signal distribution and the frequency band limits of the power distribution.

BRIEF DESCRIPTION OF THE FIGURES

In the figure description, the invention is further explained in detail. Therein.

DETAILED DESCRIPTION OF THE FIGURES

Figure 1:
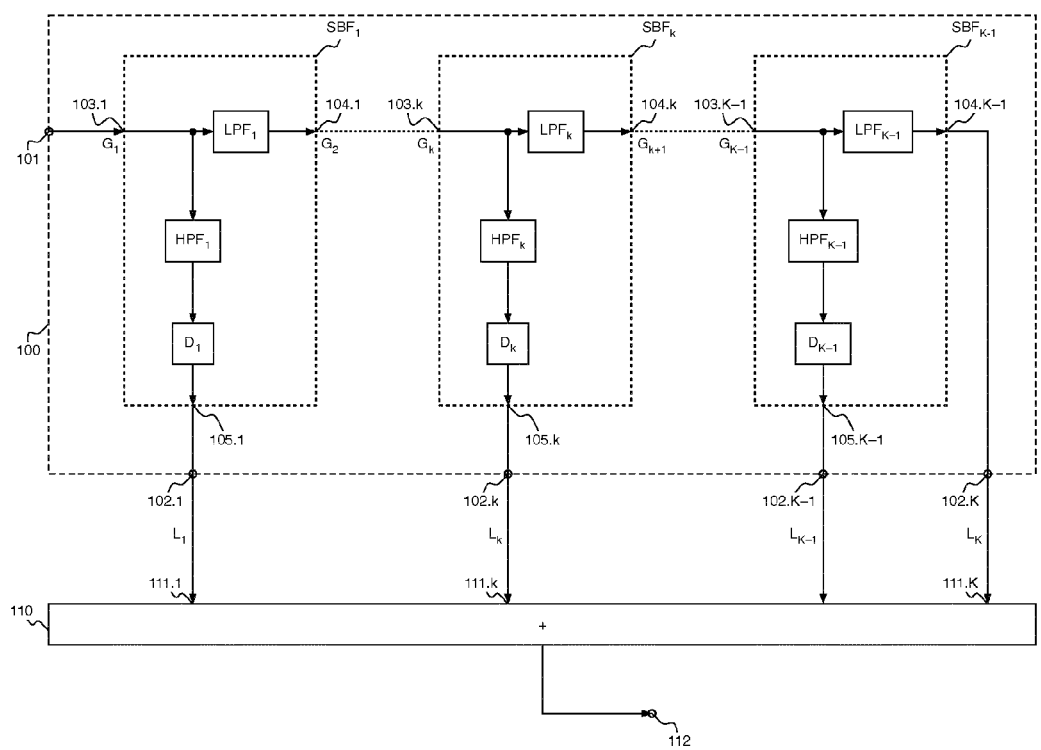
FIG. 1 shows an embodiment of the sub-band splitter unit and the sub-band combining unit.

FIG. 1 shows an embodiment of the sub-band splitter unit 100 according to the invention. The sub-band splitter unit arranged for splitting a broadband input signal ($G_1$) into K narrowband sub-band signals (L1, ..., Lk, ..., LK), wherein K is an integer greater than 1. Preferably, K≤32 is valid. The broadband input signal is, for example, an audio signal, which may already be digitized, with a bandwidth in the order of magnitude of typically 15 kHz to 30 kHz. The narrowband sub-band signals preferably are band-pass signals of the same relative bandwidth and a supplemental low-pass signal. A typical value for K is 10, wherein the band-pass signals each comprise a frequency range with the ratio 2 and 1 (octave filter bank), and the low-pass signal connects to the lowest of these frequency ranges. 'Narrow' in 'narrowband' thus is to be understood as: narrower than the bandwidth of the (broadband) input signal.

The sub-band splitter unit 100 is provided with an input terminal 101 for receiving the broadband input signal. In addition, a filter unit $SBF_1$, $SBF_2$, $SBF_3$, ... is provided for filtering the broadband input signal for generating the K narrowband sub-band signals.

The filter unit $SBF_1$, $SBF_2$, $SBF_3$, is provided with an input terminal (103.1), coupled to the input terminal 100 of the sub-band splitter unit, and K outputs, 105.1, 105.2, 105.3, ..., 105.k for supplying the K narrow-band sub-band signals.

The sub-band splitter unit 100 is further provided with K output terminals 102.1, ..., 102.k, ..., K 102.K for supplying the K sub-band signals, wherein the K output terminals are each coupled with one of the K outputs of the filter unit ($SBF_1$, $SBF_2$, $SBF_3$, ...).

According to the invention, the filter unit $SBF_1$, $SBF_2$, $SBF_3$, ... is provided with K−1 sub-band filter circuits $SBF_1$, ..., $SBF_k$, ..., $SBF_{K-1}$, wherein each of the sub-band filter circuits $SBF_k$ is provided with an input (103.k) and a first (104.k) and a second (105.k) output. A sub-band filter circuit $SBF_k$ is provided with a first filter arrangement ($LPF_k$), coupled between the input (103.k) and the first output (104.k), and with a second filter arrangement ($HPF_k$), coupled between the input (103.k) and the second output (105.k).

The first output (104.k) of a k-th sub-band filter circuit is coupled to the input $SBF_k$ (103.k+1) of the (k+1)-th sub-band filter circuit, the input (103.1) of the first sub-band filter circuit ($SBF_1$) is coupled to the input (103.1) of the filter unit $SBF_1$, $SBF_2$, $SBF_3$, ..., the second output (105.k) of a k-th sub-band filter circuit is coupled to a k-th output (105.k) of the filter unit $SBF_1$, $SBF_2$, $SBF_3$, ..., and the first output (104.K−1) of the (K−1)-th sub-band filter circuit is coupled to the K-th output (1-104.K) of the filter unit $SBF_1$, $SBF_2$, $SBF_3$ ....

The first filter arrangement ($LPF_k$) of a sub-band filter circuit $SBF_k$ is adapted to carry out a low-pass filtering that is applied to the signal at the input of the first filter arrangement, and the second filter arrangement ($HPF_k$) is adapted to carry out a high-pass filtering that is applied to the signal at the input of the second filter arrangement.

In addition, a delay line $D_k$ can be provided in the connections between the inputs 103.k and the outputs 105.k of the sub-band filter circuits. However, it is already mentioned here that these delay lines could have been included in the sub-band combining unit cooperating with the sub-band splitter unit instead of being included in the sub-band splitter unit. This sub-band combining unit is schematically indicated in FIG. 1 with reference numeral 110.

The sub-band combining unit 110 is provided with K input terminals (111.1, ..., 111.k, ..., 111.K) for receiving the K narrowband sub-band signals, and an output terminal (112), and the sub-band combining unit is adapted for combining the K narrowband sub-band signals for generating a broadband output signal that is a replica of broadband input signal of the sub-band splitter unit 100 at the output terminal 112. The sub-band combining unit 110 includes an adding unit which is adapted for adding time equivalent samples of the K narrowband sub-band signals with each other for obtaining the broadband output signal.

In the event that the delay lines $D_k$ are accommodated in the sub-band combining unit 100, the delay lines $D_k$ are connected upstream with regard to the adding unit.

What is noticeable is that, in contrast to the sub-band splitter unit and the sub-band combining unit according to the prior art, the sub-band splitter unit according to the invention is free from down-sampling means and the sub-band combining unit according to the invention is free from up-sampling means. Therefore, it is achieved that the sub-band combining unit does not require filter circuits so that the complexity of filter circuits is omitted in the sub-band combining unit.

The mode of operation of the sub-band filter circuits $SBF_k$ will be described later with reference to FIG. 3. First, an embodiment of the sub-band filtering circuits $SBF_k$ will be described in more detail in FIG. 2.

Figure 2:
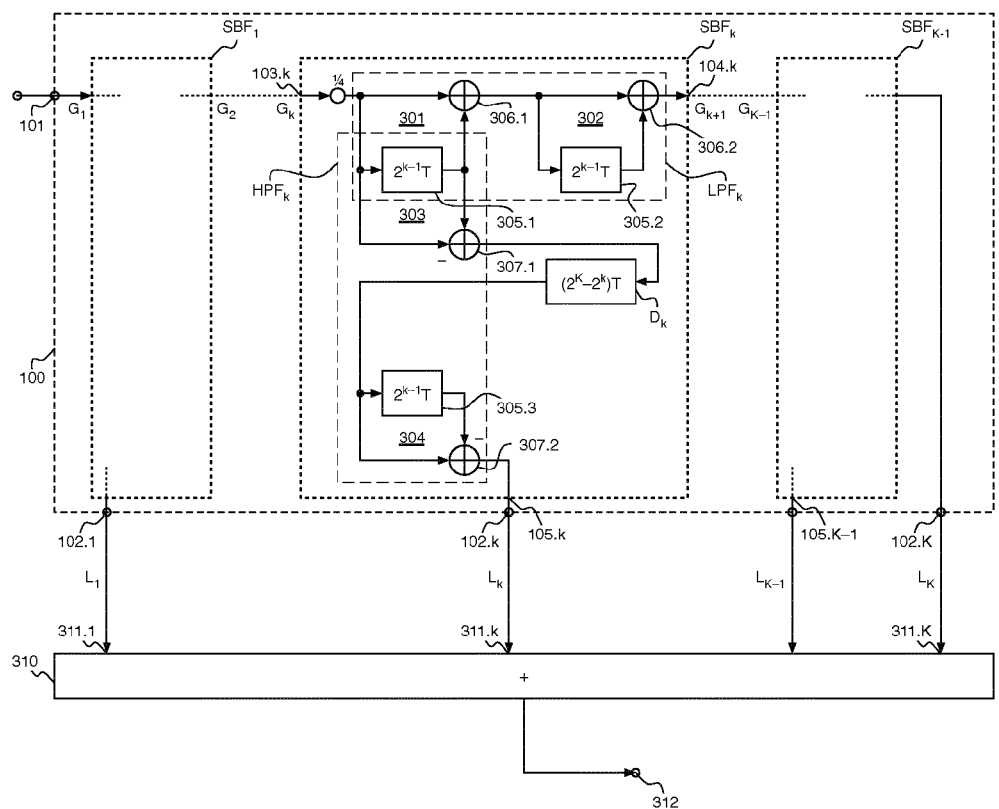
FIG. 2 shows a development of the sub-band splitter unit according to FIG. 1.
Figure 3:
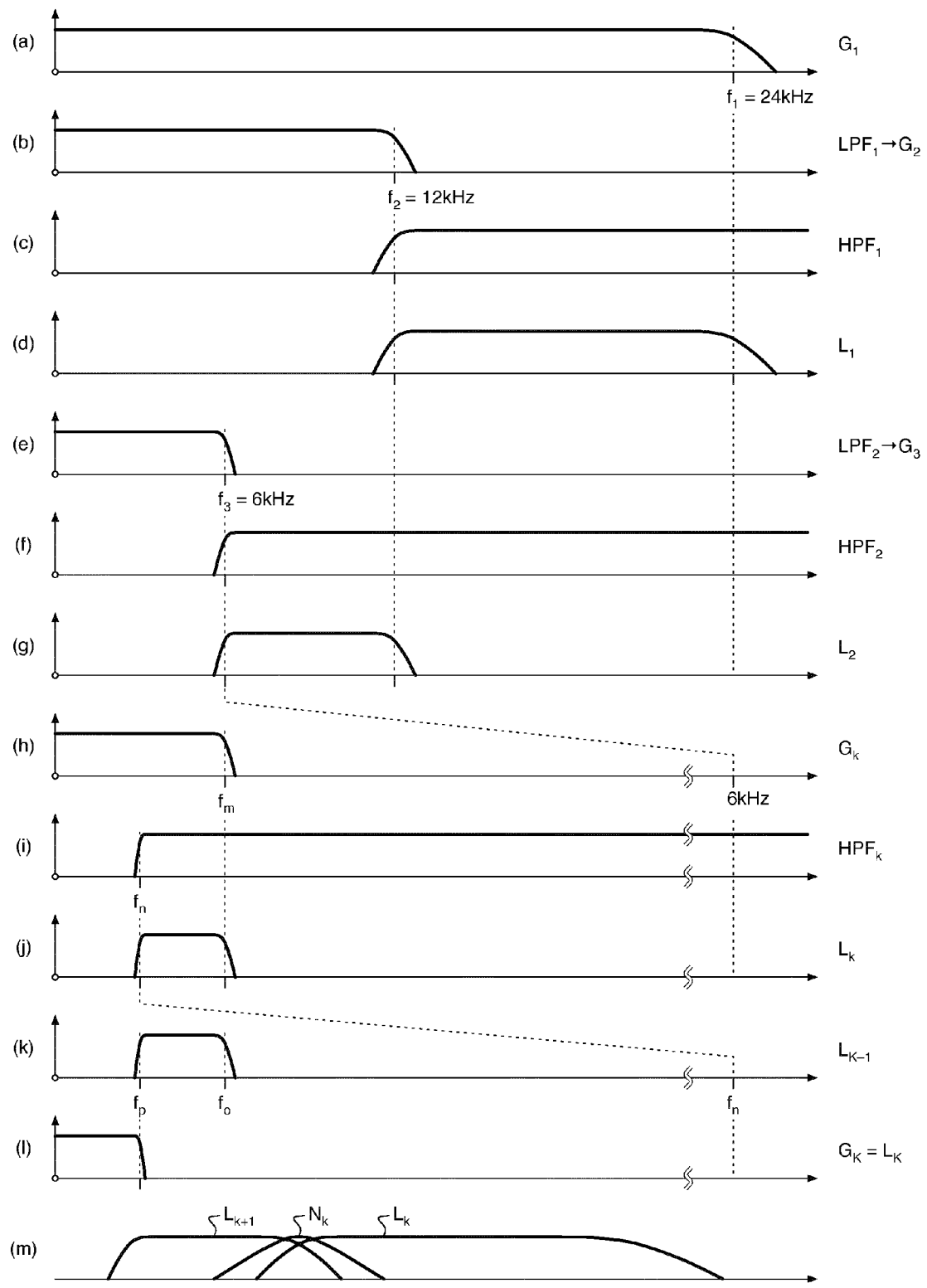
FIG. 3 shows different frequency characteristics of the signals and filter circuits in the sub-band splitter unit in FIGS. 1 and 2.

FIG. 2 shows an embodiment of a sub-band filter circuit $SBF_k$ in the sub-band splitter unit 100 according to FIG. 1. As already described with reference to FIG. 1, the sub-band filter circuits $SBF_1$ to $SBF_{K-1}$ are connected in series. In FIG. 2, only the circuit structure of the sub-band filter circuit $SBF_k$ is given in detail. It speaks for itself that the other sub-band filter circuits are built the same way.

The first filter arrangement $LPF_k$ in the sub-band $SBF_k$ filter circuit includes a series connection of a first filter block 301 and a second filter block 302. Each of the two filter blocks 301, 302 is provided with a delay line 305.1, 305.2 and a signal combining unit, preferably an adding unit 306.1, 306.2, wherein the input of the filter block 301, 302 is coupled to an input of the delay line 305.1, 305.2 and a first input of the adding unit 306.1, 306.2, an output of the delay line 305.1, 305.2 is coupled to a second input of the adding unit 306.1, 306.2, and an output of the adding unit 306.1, 306.2 is coupled to an output of the filter block 301, 302.

The second filter arrangement $HPF_k$ in the sub-band filter circuit $SBF_k$ includes a series connection of a third filter block 303 and of a fourth filter block 304. Each of the two filter blocks 303, 304 is provided with a delay line 305.1, 305.3 and a signal combining unit, preferably a subtracting unit 307.1, 307.2, wherein the input of the filter block 303, 304 is coupled to an input of the delay line 305.1, 305.2 and to a first input of the subtracting circuit 307.1 and 307.2, an output of the delay line 305.1, 305.2 is coupled to a second input of the subtracting unit circuit 307.1 and 307.2, and an output of the subtracting circuit 307.2 and 307.1 is coupled to an output of the filter block 303 and 304.

Further, the delay line $D_k$ is arranged between the two filter blocks 303 and 304, although this is, of course, not an absolute necessity. This delay line $D_k$ just as well could have been located between the filter block 304 and the output 102.k.

As seen in FIG. 2, the filter blocks 301 and 303 have their delay lines 305.1 in common.

The delay lines 305.1, 305.2, and 305.3 in the filter blocks 303-304 in the sub-band filter unit $SBF_k$ realize a signal delay of $2^{k-1} \cdot T$, wherein T is the sampling time of the sampling values of the signals. The delay line $D_k$ realizes a signal delay of $(2^k - 2^k) \cdot T$.

The operation of the sub-band filter circuits $SBF_k$ is further explained with reference to FIG. 3.

FIG. 3a shows the input signal at the input 101 in a schematic manner, and shows the bandwidth $f_1$ of the broadband input signal, which is supplied as the signal $G_1$ to the first sub-band filter circuit $SBF_1$. As an example, it is assumed a bandwidth of 24 kHz. The low-pass filter characteristic of the low-pass filter circuit $LPF_1$ and the series connection of the filter blocks 301 and 302 in the first sub-band filter circuit $SBF_1$ is indicated in FIG. 3b and shows a bandwidth $f_2$ that is smaller than the bandwidth of the input signal, in this example equal to 12 kHz. The bandwidth of the output signal $G_2$ of the sub-band filter circuit $SBF_1$ thus is smaller than the bandwidth of the input signal $G_1$. The high pass filter characteristic of the high-pass filter $HPF_1$ circuit and hence the series connection of the filter blocks 303 and 304 in the first sub-band filter circuit $SBF_1$ is indicated in FIG. 3c and shows a lower cut-off frequency that is smaller than $f_1$. In this example, this lower cutoff frequency is equal to the cutoff frequency $f_2$, i.e., equal to 12 kHz. The high pass filter circuit $HPF_1$ and thus the series connection of the filter blocks 303 and 304 therefore filter the input signal $G_1$, which is limited to $f_1$ with regard to bandwidth, so that a band-pass filtered output signal $L_1$ is formed between 12 kHz and 24 kHz, as indicated in FIG. 3d.

FIG. 3b shows the bandwidth of the input signal that is supplied to the second sub-band filter circuit $SBF_2$ as the signal $G_2$. The low-pass filter characteristic of the low-pass filter circuit $LPF_2$ and the series connection of the filter blocks 301 and 302 in the second sub-band filter circuit $SBF_2$ is indicated in FIG. 3e shows a bandwidth $f_3$ that is smaller than the bandwidth of the input signal $G_2$. In this example, the bandwidth is equal to 6 kHz. The bandwidth of the output signal $G_3$ of the sub-band filter $SBF_2$ thus is smaller than the bandwidth of the input signal $G_2$. The high pass filter characteristic of the high pass filter circuit $HPF_2$ and hence the series connection of the filter blocks 303 and 304 in the second sub-band filter circuit $SBF_2$ is indicated in FIG. 3f and shows a lower cut-off frequency that is smaller than $f_2$.

In this example, the lower cutoff frequency is equal to the corner frequency $f_3$, i.e., equal to 6 kHz. The high pass filter circuit $HPF_2$ and thus the series connection of the filter blocks 303 and 304 therefore filter the input signal $G_2$, which is limited to $f_2$ with regard to bandwidth, so that a band-pass filtered output signal $L_2$ between 6 kHz and 12 kHz is generated, as indicated in FIG. 3g.

FIGS. 3h to 3j have frequency axes that are extended with regard to the frequency axes in FIGS. 3a to 3g. FIG. 3h shows the bandwidth $f_m$ of the input signal, which is supplied to the k-th sub-band filter circuit $SBF_k$ as the signal $G_k$. The high pass filter characteristic of the high pass filter circuit $HPF_k$ and thus the series connection of the filter blocks 303 and 304 in the k-th sub-band filter circuit $SBF_k$ is indicated in FIG. 3i and shows a lower cut-off frequency that is smaller than $f_m$. In this example, the lower cutoff frequency, indicated by $f_n$, is equal to half of the frequency $f_m$. The high pass filter circuit $HPF_k$ and thus the series connection of the filter blocks 303 and 304 therefore filter the input signal $G_k$, which is limited to $f_m$ with regard to bandwidth, so that a band-pass filtered output signal $L_k$ between fn and fm is generated, as indicated in FIG. 3j.

FIGS. 3k and 3l have frequency axes, which are extended with regard to the frequency axes in FIGS. 3h and 3j. FIG. 3k shows the bandwidth of the output signal $L_{K-1}$, which is supplied to the second output of the sub-band filter circuit $SBF_{K-1}$. In the same manner, the sub-band filter circuit $SBF_{K-1}$ generates, at its first output, the output signal $G_K$ and thus the sub-band signal $L_K$.

For K=10, the cut-off frequencies, in this example, lie at ($f_p=$) 46.875 Hz ($f_o=$) 93.75 Hz, 187.5 Hz, 375 Hz, 750 Hz, 1.5 kHz, 3 kHz, ($f_3=$) 6 kHz ($f_2=$) 12 kHz, and ($f_1=$) 24 kHz.

Figure 4:
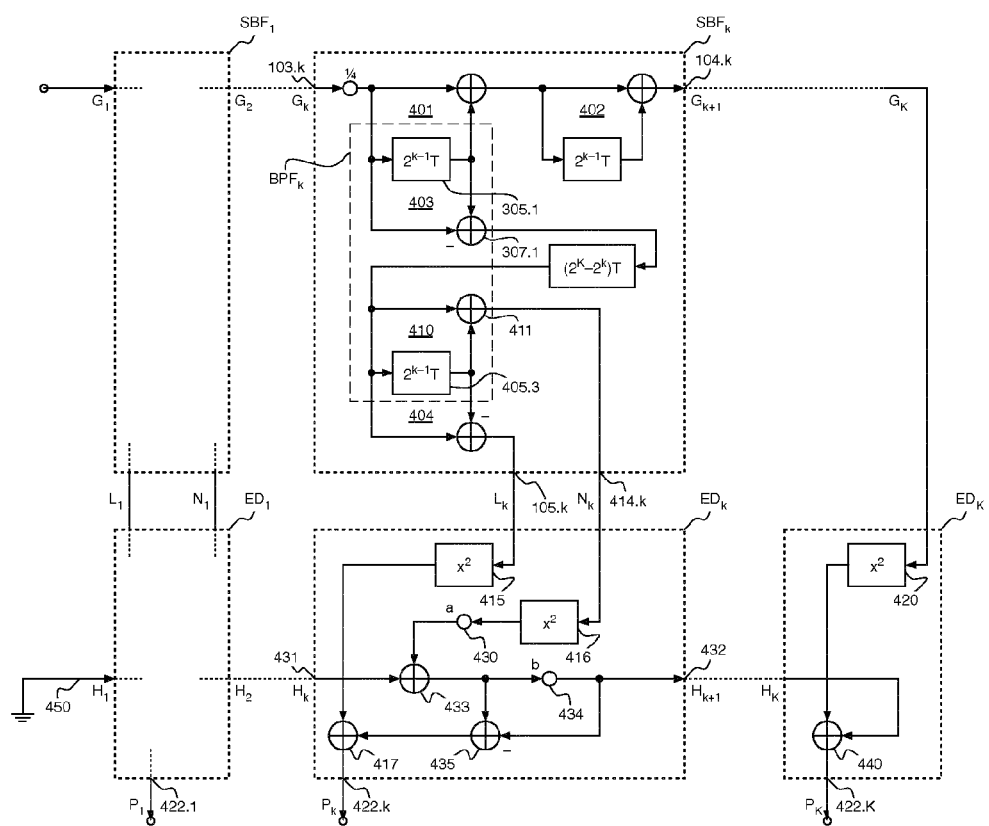
FIG. 4 shows an embodiment of an envelope curves detector according to the invention.

FIG. 4 shows an embodiment of an envelope curves detector for measuring the envelope curves of K sub-band signals of a broadband input signal, such as the input signal in the FIGS. 1 and 2. The envelope curves detector as shown in FIG. 4 contains the K−1 sub-band filter circuits of the sub-band splitter unit 100 in FIGS. 1 and 2. In addition, the envelope curves detector is provided with K−1 sub detector circuits EDk, one sub detector circuit for each of the K−1 sub-band filter circuits $SBF_k$. Additionally, there is a K-th partial detector circuit $ED_K$.

Each of the K−1 sub-band filter circuits $SBF_k$ is provided with a third filter arrangement, coupled between the input 103.k and a third output 414.k of the sub-band filter circuits $SBF_k$. The third sub-band filter arrangement $BPF_k$ of a sub-band filter circuit is adapted for carrying out a band pass filtering that is applied to the signal at the input of the third filter arrangement.

In FIG. 4, the third sub-band filter arrangement $BPF_k$ of a filter circuit $SBF_k$ is constructed as a series connection of a fifth 403 and a sixth filter block 410. In FIG. 4, the fifth filter block 403 is constructed with a delay line 305.1 and a subtracting unit circuit 307.1, and the sixth filter block 410 is constructed with a delay line 405.3 and an adding unit 411. It is clear from FIG. 4 that the fifth filter block is equal to the third filter block 403. In addition, it is clear from FIG. 4 that the fourth filter block 404 and the sixth filter block 410 have their delay lines 405.3 in common.

Finally, the frequency characteristics of the output signals $L_k$ and $N_k$, which are present at the outputs 105.k and 414.k of the sub-band filter circuit $SBF_k$, and $L_{k+1}$, which is present at the output 105.k+1 of the following sub-band filter circuit $SBF_{k+1}$, are schematically indicated in FIG. 3m.

It can clearly be seen that the auxiliary signal $N_k$ is a narrowband auxiliary signal that lies in the frequency range between the narrowband sub-band signals $L_k$ and $L_{k+1}$.

The reason for the presence of K−1 auxiliary signals $N_k$ is that, although the sub-band signals $L_k$ additively reconstitute a replica of the broadband input signal at the input 101 (apart from a delay, which is irrelevant for the present consideration), the powers $L_k^2$ of these sub-band signals $L_k$, if integrated, generally do not additively reconstitute the integrated power of the integrated broadband input signal at the input 101.

If only the sub-band signals $L_k$ were used for deriving sub-band envelope curves, then the integrated power of the input signal at the input 101 could not be accurately represented by the total of such sub-band envelope curves, but would be defective in dependence of the signal. In order to compensate for this error, the auxiliary signals $N_k$ are additionally used.

In that the auxiliary signals $N_k$ complement the filter bank to an orthogonal system, they provide for the power, which is missing for additive reconsitution, in the form of the scaled auxiliary signal power $a \cdot N_k^2$, wherein, for the scaling factor a, the value of a=2 is suitable.

To each sub-band signal power, the corresponding scaled auxiliary signal power is additively added so that the error compensation is achieved.

Each of the K−1 sub detector circuits $ED_k$ is provided with
- a first rectifier circuit, preferably a first squaring circuit 415, having an input, coupled to an output 105.k of the sub-band filter circuit $SBF_k$, and an output,
- a second rectifier circuit, preferably a second squaring circuit 416, having an input, coupled to the output 414.k of the sub-band filter circuit ($SBF_k$), and an output, and
- a signal combining circuit 417 having a first and second input, coupled to the output of the first and second rectifier circuit (square circuit) 415, 416, and an output.

A squaring circuit is preferably used as rectifier circuit because thereby the total envelop curve of the envelope curves from the sub detector units optimally represents the integrated power of the input signal at the input 101.

The envelope curves detector is provided with K outputs 422.1 K, . . . 422.k, . . . 422.K for supplying envelope curves signals, which are a measure of the envelope curves of the K sub-band signals.

The sub detector unit $ED_K$ is provided with an additional rectifier circuit, again preferably an additional squaring circuit 420, having an input, coupled to the output of the (K−1)-th sub-band filter circuit $SBF_{K-1}$, and an output, coupled to the K-th output 422.K of the envelope curves detector. The outputs of the signal combining circuits 417 of the K−1 sub-band filtering circuits SBFk are coupled to associated outputs 422.k of the envelope curves detector.

Preferably, each of the K−1 sub detector circuits $ED_1$ to $ED_{K-1}$ is further provided with a multiplier unit 430, which is arranged between the output 414.k of the sub-band filter circuit $SBF_k$ and the second input of the signal combining circuit 417.

The multiplier unit 430 is arranged for multiplying a signal at its input by a multiplication factor a, preferably equal to 2.

In this embodiment example, the envelope curves detector has an input 450 for receiving an auxiliary input signal $H_1$. The input 450 is preferably coupled to ground. The signal $H_1$ is supplied as an auxiliary signal to the sub detector circuit $ED_1$. Further, each of the K−1 sub detector circuits $ED_1$ to $ED_{C-1}$ in the envelope curves detector is provided with an auxiliary signal input 431 and an auxiliary signal output 432.

The auxiliary signal input of the first detector circuit is coupled to the input 450. The auxiliary signal input of the k-th sub detector circuit is coupled to the auxiliary signal output of the (k−1)-th sub detector circuit.

A series connection of a second signal combining circuit 433 and a second multiplier unit 434 is arranged between the auxiliary signal input 431 and auxiliary signal output 432 of a sub detector circuit. Further, a signal combining circuit in the form of a subtracting circuit 435 is also provided with a first input, coupled to the output of the adding circuit 433, a second input coupled to the output of the multiplier circuit 434, and an output, coupled to the second input of the adding circuit 417. The circuit of the multiplying unit 434 and the subtracting unit 435 realizes a multiplication applied to the output signal of the adding unit 433 by a value of (1−b) and results in a signal that is provided to the second input of the adding unit 417.

Preferably, 0≤b≤1 holds true for the value b. For b=0, it holds true that the sub detector circuit is then simplified to uncoupled sub detecting circuits (i.e., without auxiliary signals Hk) and to a direct coupling between the output of the multiplying unit 430 and the second input of the adding unit 417 so that adding unit 433 and subtracting unit 435 can be omitted. For b=0.5, it holds true that the partial detector circuit is also simplified in that subtracting unit 435 can be omitted.

The sub detector circuit $ED_K$ additionally contains an adding unit circuit 440 having a first input coupled with the auxiliary signal output of the (K−1)-th sub detector circuit, and a second input, coupled to the output of the rectifier circuit (preferably squaring circuit) 420, and an output, coupled to the output of the envelope curves detector 422.K.

The output signal of the adding unit 417 is the envelope curves signal $P_K$.

It is here indicated that the invention is not limited to the shown embodiment examples. The invention is limited to embodiment examples as defined by the claims.

The invention claimed is:

1. A sub-band splitter for splitting a broadband input signal into K narrowband sub-band signals (L1, . . . , Lk, . . . , LK), wherein K is an integer number larger than 1, and wherein the sub-band-splitter is provided with:
   an input terminal for receiving the broadband input signal,
   a filter unit (SBF1, SBF2, SBF3, . . . ) for filtering the broadband input signal for generating the K narrowband sub-band signals, provided with an input (103.1), coupled to the input terminal of the sub-band splitter, and with K outputs (105.1, 105.2, . . . , 105.k, . . . ) for supplying the K narrowband sub-band signals,
   K output terminals (102.1, . . . , 102.k, . . . , 102.K) for supplying the K sub-band signals, wherein the K output terminals are each coupled to one of the K outputs (105.1, 105.2, 105.3, . . . ) of the filter unit,
   wherein
   the filter unit is provided with K−1 sub-band filter circuits (SBF1, . . . , SBFk, . . . , SBFK−1), each of the sub-band filter circuits (SBFk) is provided with
   an input (103.k) and a first (104.k) and a second (105.k) output,
   a first filter arrangement (LPFk), coupled between the input (103.k) and the first output (104.k),
   a second filter arrangement (HPFk), coupled between the input (103.k) and the second output (105.k),
   and wherein
   the first output (104.k) of a k-th sub-band filter circuit (SBFk) is coupled to the input (103.k+1) of the (k+1)-th sub-band filter circuit,
   the input of the first sub-band filter circuit (SBF1) is coupled with the input of the filter unit (SBF1, SBF2, SBF3, . . . ),
   the second output (105.k) of a k-th sub-band filter circuit is coupled with a k-th output (102.k) of the filter unit (SBF1, SBF2, SBF3, . . . ), and
   the first output (104.K−1) of the (K−1)-th sub-band filter circuit is coupled to the K-th output (104.K−1) of the filter unit, and wherein
   the first filter arrangement (LPFk) of a sub-band filter circuit is adapted for carrying out a lowpass filtering on the signal at the input of the of the first filter arrangement,
   and the second filter arrangement (HPFk) is adapted for carrying out a highpass filtering on the signal at the input of the second filter arrangement,
   and wherein the sub-band splitter unit is devoid of downsampling means,
   and wherein the first filter arrangement (LPF1) comprises a series connection of a first and a second filter block, each filter block is provided with a delay line and a first signal combination unit, the input of one of the filter blocks is coupled to an input of the delay line and a first input of the first signal combination unit, an output of the delay line is coupled to a second input of the first signal combination unit and an output of the first signal combination unit is coupled to an output of the filter block.

2. The sub-band splitter according to claim 1, wherein the first filter arrangement (LPF1) of a sub-band filter circuit (SBF1) is provided with a lowpass filter characteristic having a lowpass cutoff frequency and the second filter arrangement (HPF1) of this sub-band filter circuit is provided with a highpass filter characteristic having a highpass cutoff frequency, and that the frequency value of the lowpass cutoff frequency is substantially the same as the frequency value of the highpass cutoff frequency (f2).

3. The sub-band splitter according to claim 2, wherein the frequency value (fm) of the lowpass cutoff frequency of the lowpass filter characteristic of the first filter arrangement (LPF1) of the k-th sub-band filter circuit is larger than the frequency value of the lowpass cutoff frequency (fn) of the lowpass filter characteristic of the first filter arrangement (LPF2) of the (k+1)-th sub-band filter circuit (FIG. 3$h,i$), and the frequency value (f2) of the highpass cutoff frequency of the highpass filter characteristic of the second filter arrangement (HPF1) of the k-th sub-band filter circuit is larger than the frequency value (f3) of the highpass cutoff frequency of the highpass filter characteristic of the second filter arrangement (HPF2) of the (k+1)-th sub-band filter circuit, wherein k=1, 2, . . . , K−2.

4. The sub-band splitter according to claim 1, wherein the second filter arrangement (HPF1) comprises a series connection of a third and a fourth filter block, that each filter block is provided with a delay line and a second signal combination unit, that the input of a filter block is coupled to an input of the delay line and a first input of the second signal combination unit, an output of the delay line is coupled to a second input of the second signal combination unit, and an output of the second signal combination unit is coupled to an output of the filter block.

5. The sub-band splitter according to claim 1, wherein the delay lines in the filter blocks of the k-th sub-band filter circuit exhibit a delay time of 2k−1.T, wherein T is the sampling time between samples of the input signal of the sub-band splitter.

6. The sub-band splitter according to claim 1, wherein the first and third filter blocks have their delay lines in common.

7. A sub-band splitter for combining the K narrowband sub-band signals of the sub-band splitter according to claim 1, provided with
K input terminals (111.1, . . . , 111.k, . . . , 111.K) for receiving the K narrowband sub-band signals, and
an output terminal,
that the sub-band combining is adapted for combining the K narrowband sub-band signals to generate a broadband output signal, which is a replica of the broadband input signal of the sub-band splitter, and for supplying the broadband output signal at its output terminal,
wherein the sub-band combining is adapted for adding time equivalent samples of the K narrowband sub-band signals for generating the broadband output signal,
wherein the sub-band combining is devoid of up-sampling unit, and is devoid of sub-band synthesis filter.

8. An envelope detector for measuring an envelope curves of K sub-band signals of a broadband input signal, wherein the envelope detector comprises
a sub-band splitter for splitting a broadband input signal into K narrowband sub-band signals (L1, . . . , Lk, . . . , LK), wherein K is an integer number larger than 1, and wherein said sub-band-splitter is provided with:
an input terminal for receiving the broadband input signal,
a filter unit (SBF1, SBF2, SBF3, . . . ) for filtering the broadband input signal for generating the K narrowband sub-band signals, provided with an input (103.1), coupled to the input terminal of the sub-band splitter, and with K outputs (105.1, 105.2, . . . , 105.k, . . . ) for supplying the K narrowband sub-band signals,
K output terminals (102.1, . . . , 102.k, . . . , 102.K) for supplying the K sub-band signals, wherein the K output terminals are each coupled to one of the K outputs (105.1, 105.2, 105.3, . . . ) of the filter unit, wherein
the filter unit is provided with K−1 sub-band filter circuits (SBF1, . . . , SBFk, . . . , SBFK−1), each of the sub-band filter circuits (SBFk) is provided with
an input (103.k) and a first (104.k) and a second (105.k) output,
a first filter arrangement (LPFk), coupled between the input (103.k) and the first output (104.k),
a second filter arrangement (HPFk), coupled between the input (103.k) and the second output (105.k),
and wherein
the first output (104.k) of a k-th sub-band filter circuit (SBFk) is coupled to the input (103.k+1) of the (k+1)-th sub-band filter circuit,
the input (103.1) of the first sub-band filter circuit (SBF1) is coupled with the input (103.1) of the filter unit (SBF1, SBF2, SBF3, . . . ),
the second output (105.k) of a k-th sub-band filter circuit is coupled with a k-th output (102.k) of the filter unit (SBF1, SBF2, SBF3, . . . ), and
the first output (104.K−1) of the (K−1)-th sub-band filter circuit is coupled to the K-th output (104.K−1) of the filter unit,
and wherein
the first filter arrangement (LPFk) of a sub-band filter circuit is adapted for carrying out a lowpass filtering on the signal at the input of the of the first filter arrangement,
and the second filter arrangement (HPFk) is adapted for carrying out a highpass filtering on the signal at the input of the second filter arrangement,
and wherein
one of the sub-band filter circuits (SBFk) is further provided with a third filter arrangement coupled between the input (103.k) and a third output (414.k) of the sub-band filter circuits (SBFk), the third filter arrangement (BPFk) of a sub-band filter circuit is adapted to carry out a bandpass filtering on the signal present at the input of the third filter arrangement, in that the envelope detector is provided with K−1 sub detector circuits, one for each of the K−1 subband filter circuits, each of the K−1 sub detector circuits (EDk) is provided with:
a. a first rectifier circuit, having an input, coupled to an output (105.k) of the second filter arrangement (HPFk) of the sub-band filter circuit (SBFk), and an output,
b. a second rectifier circuit, having an input, coupled to the output (414.k) of the third filter arrangement (BPFk) of the sub-band filter circuit (SBFk), and an output,
c. a signal combining circuit having a first and a second input, coupled to the output of the first and second rectifier circuit, respectively, and an output,
and wherein the envelope detector is further provided with a K-th sub detector circuit and with K outputs (422.1, . . . 422.k, . . . 422.K) for supplying the K envelope curves signals, which are a measure for the envelope curves of the K sub-band signals, the K-th sub detector circuit is provided with an additional rectifier circuit, having an input, coupled to the first output of the (K−1)-th sub-band filter circuit (SBFK−1), and an output, coupled to the K-th output (422.K) of the envelope detector, and the outputs of the signal combining circuits of the K−1 sub-band filter circuits (SBFk) are coupled to corresponding outputs (422.k) of the envelop detector.

9. The envelope detector according to claim 8, wherein the third filter arrangement of a sub-band filter circuit (SBFk) comprises a series connection of a fifth and a sixth filter block, a filter block is provided with a delay line and a subtracting unit, the input of the filter block is coupled to an input of the delay line and a first input of the subtracting unit, an output of the delay line is coupled to a second input of the subtracting unit, and an output of the subtracting unit is coupled to an output of the filter block, the other filter block is provided with a delay line and an adding circuit, the input of the other filter block is coupled to an input of the delay line and a first input of the adding circuit unit, an output of the delay line is coupled to a second input of the adding circuit, and an output of the adding circuit is coupled to an output of the other filter block, and the output of one of the filter blocks is coupled to the third output of the sub-band filter circuit (SBFk).

10. The envelope detector according to claim 9, wherein the sixth filter block follows the fifth filter block in the series connection of the fifth filter block and the sixth filter block.

11. The envelope detector according to claim 10, wherein the fifth filter block is identical to the third filter block.

12. The envelope detector according to claim 9, wherein the fourth filter block and the sixth filter block have their delay lines in common.

13. The envelope detector according to claim 8, wherein each of the K−1 sub detector circuits (ED1, . . . , EDK−1) is further provided with a multiplier unit coupled between the output (414.k) of the third filter arrangement and the second input of the signal combination circuit, wherein the multiplier unit is adapted to multiply a signal at its input by a multiplication factor (a).

14. The envelope curves detector according to claim 8, wherein each of the K−1 sub detector circuits (ED1, . . . , EDK−1) is further provided with a. an auxiliary signal input and an auxiliary signal output,
b. a second signal combination circuit having a first and a second input and an output, and
c. a second multiplier unit, wherein a series connection of the second signal combination circuit and the second multiplier unit is coupled between the auxiliary signal input and the auxiliary signal output, the first input of the second signal combination circuit is coupled to the output of the second rectifier circuit and the output of the second signal combination circuit is coupled to the second input of the first signal combination circuit, in that the auxiliary signal output of the k-th sub detector circuit (EDk) is coupled to the auxiliary signal input of the (k+1)-th sub detector circuit (EDk+1), and the K-th sub detector circuit (EDK) is further provided with an additional signal combination circuit having a first input, coupled to the auxiliary signal output of the (K−1)-th sub detector circuit (EDK−1), a second input, coupled to the output of the additional rectifier circuit, and an output, coupled to the K-th output (422.K) of the envelope detector.

15. The envelope detector according to claim 14, wherein each of the K−1 sub detector circuits (EDk) is further provided with a third signal combination circuit, having a first input, coupled to the output of the second signal combination circuit, a second input, coupled to the output of the second multiplier unit, and an output, coupled to the second input of the first signal combination unit.

16. The envelope detector according to claim 15, wherein the second multiplier unit is adapted to multiply a signal applied to its input by a multiplication factor b.

17. The envelope detector according to claim 14, wherein, for said multiplication factor (b), $0 \leq b \leq 1$ is valid.

\* \* \* \* \*